United States Patent
Huff

(10) Patent No.: US 7,052,926 B2
(45) Date of Patent: May 30, 2006

(54) FABRICATION OF MOVABLE MICROMECHANICAL COMPONENTS EMPLOYING LOW-COST, HIGH-RESOLUTION REPLICATION TECHNOLOGY METHOD

(75) Inventor: Michael A. Huff, Oakton, VA (US)

(73) Assignee: Corporation for National Research Initiatives, Reston, VA (US)

( * ) Notice: Subject to any disclaimer, the term of this patent is extended or adjusted under 35 U.S.C. 154(b) by 0 days.

(21) Appl. No.: 11/015,721

(22) Filed: Dec. 20, 2004

(65) Prior Publication Data

US 2005/0136565 A1    Jun. 23, 2005

Related U.S. Application Data

(60) Provisional application No. 60/530,260, filed on Dec. 18, 2003.

(51) Int. Cl.
*H01L 21/00* (2006.01)

(52) U.S. Cl. .............. 438/48; 438/50; 438/52; 438/53

(58) Field of Classification Search ........ 438/48–53, 438/107–127, 420–422; 216/2; 257/415, 257/417
See application file for complete search history.

(56) References Cited

U.S. PATENT DOCUMENTS

| | | | |
|---|---|---|---|
| 5,496,668 A * | 3/1996 | Guckel et al. ............ 430/9 |
| 5,858,622 A * | 1/1999 | Gearhart ............ 430/315 |
| 6,461,888 B1 * | 10/2002 | Sridhar et al. ............ 438/52 |
| 6,477,225 B1 * | 11/2002 | Morales et al. ............ 378/35 |
| 6,482,553 B1 * | 11/2002 | Gottert et al. ............ 430/5 |
| 2002/0117599 A1 * | 8/2002 | Domeier et al. ............ 249/134 |
| 2003/0062652 A1 * | 4/2003 | Lee et al. ............ 264/227 |
| 2003/0080472 A1 * | 5/2003 | Chou ............ 264/338 |
| 2003/0091752 A1 * | 5/2003 | Nealey et al. ............ 427/558 |
| 2003/0219992 A1 * | 11/2003 | Schaper ............ 438/748 |
| 2004/0087162 A1 * | 5/2004 | Vogeli ............ 438/694 |
| 2004/0089903 A1 * | 5/2004 | Fischer et al. ............ 257/414 |
| 2004/0146139 A1 * | 7/2004 | Morales ............ 378/35 |
| 2004/0206881 A1 * | 10/2004 | Tavkhelidze et al. .... 249/114.1 |

(Continued)

OTHER PUBLICATIONS

Qu et al, UV-LIGA: A Promising and Low-Cost Variant for Microsystem technology, 1999 IEEE pp 380383.*

(Continued)

*Primary Examiner*—Savitri Mulpuri
(74) *Attorney, Agent, or Firm*—Nixon & Vanderhye P.C.

(57) ABSTRACT

A method of fabricating a high-aspect ratio micro-mechanical device or system with dimensions that can vary from nanometers to millimeters is disclosed. According to the method, a tool master with a high-aspect ratio, submicron lateral resolution and vertical dimensions substantially corresponding to the vertical dimensions of the device or system is formed. The tool master and a substrate sized for the device or system are heated to a temperature at which the substrate becomes compliant. The heated tool master and substrate are then pressed together so as to imprint the shape and form of the tool master into the substrate. The temperature of the tool master and substrate are then lowered, whereupon the tool master and substrate are separated and cooled to ambient temperature. The tool master can have a plurality of duplications to form a plurality of devices or systems. The substrate is composed of a laminate comprised of a sacrificial layer and a structural layer. The sacrificial layer can be removed to release the structural layer and thereby form a movable device or system.

28 Claims, 7 Drawing Sheets

U.S. PATENT DOCUMENTS

2004/0239006 A1* 12/2004 Hong .......................... 264/400
2005/0056074 A1* 3/2005 Meng .......................... 72/352

OTHER PUBLICATIONS

McNie et al, Advanced Micromechanical Prototyping In Polysilcion AnD SOI Pp 8/1 to 8/4.*

Wang et al, "Fabrication of Monolithic Multilevel High-aspect-Ratio Ferromagnetic Devices" Journal of Micrelctromecahnical Systems, vol. 14, No. 2, Aril 2005 pp 400-409.*

Sugiyam et al, a compact SR beamline for Fabrication of High aspect Ratio MEMS Microparts1996 IEEE pp 79-84.*

* cited by examiner

Etch

Deposit Polymer

Etch

FABRICATION OF MOVABLE MICROMECHANICAL COMPONENTS EMPLOYING LOW-COST, HIGH-RESOLUTION REPLICATION TECHNOLOGY METHOD

CROSS-REFERENCE TO RELATED APPLICATION

This application claims the benefit of Provisional Application Ser. No. 60/530,260, filed Dec. 18, 2003, the entire contents of which are hereby incorporated by reference in this application.

FIELD OF THE INVENTION

The present invention relates generally to a very low-cost and extremely flexible replication fabrication technology wherein Micro-Electro-Mechanical Systems (MEMS), Micro-Opto-Electro-Mechanical Systems (MOEMS), micromechanical, and High-Aspect Ratio Micromechanical (HARM) devices and systems can be fabricated such that selected functional mechanical components of the device or system can be subsequently released so as to enable such selected functional elements of a device or system to move with one or more degrees of freedom while still having anchoring regions of the elements attached to the substrate in some manner.

BACKGROUND OF THE INVENTION

Micro-Electro-Mechanical Systems (MEMS), Micro-Opto-Electro-Mechanical Systems (MOEMS), and micromachining technologies are being actively developed by many organizations for implementing devices and systems for a wide diversity of applications in many products and industries. These technologies offer many distinct benefits including: the ability to make complex mechanical elements and systems on a small dimensional scale; the ability to integrate electronics or photonics with micromechanical elements to embody integrated electro-mechanical, opto-mechanical, or electro-opto-mechanical systems; higher levels of reliability; smaller size and weight; higher levels of functionality; and lower cost through batch fabrication techniques. Most MEMS and micromachined devices and systems that have been reported in the research literature as well as those that have been successfully commercialized are made using either bulk or surface micromachining techniques. Furthermore, most have used silicon in single crystal form or deposited polycrystalline silicon as the material from which the devices and systems have been made.

Bulk micromachining is a widely used technique for realizing MEMS and micromechanical components and systems. Using this technique, the wafer or substrate itself is selectively shaped and formed using selective etching techniques so as to implement micromechanical components and systems. Most often silicon is the preferred substrate material used in this technique, but other substrates have been used as well including glass, ceramics, gallium arsenide, etc. Bulk micromachining can be performed using wet etchants or dry plasma etch processes, but most of the more established processes use a wet etchant such as Potassium Hydroxide (KOH) that exploits the anisotrophic nature of etching of silicon crystal in certain crystallographic directions. Commonly, a masking layer (e.g., silicon dioxide, silicon nitride, etc.) or specially modified layer (e.g., heavy boron doping) is used to resist the etching of the silicon substrate at certain locations on the surface of the substrate and provides another means, beyond the crystallographic dependency of the etchant, to form the desired shapes of microstructures. A common bulk micromachining technique is to deposit a thin-film layer that is resistant to the etchant solution onto the surface of a silicon substrate and then to pattern and etch the masking layer so as to selectively expose certain areas of the silicon substrate surface. The silicon substrate is then immersed into a suitable anisotropic etchant and the exposed areas of the silicon substrate are selectively etched. The etchant will remove the silicon from the exposed regions and if the etchant is of the anisotropic variety, the etching will proceed along certain crystal planes at a rapid rate and other crystal planes at a much slower etch rate. The resultant etch profile of the crystalline substrate will display a faceting pattern due to the crystallographic orientation etch dependence.

An etch stop layer is frequently employed in bulk micromachining to enable another degree of freedom in making microstructures of the desired shape or enabling better control of the etching process. The etch stop layer is essentially a layer of suitably modified silicon or a layer of different material that is resistant to the anisotropic etchant. In one method to create an etch stop layer, heavy doses of Boron are introduced into the silicon lattice, usually through a thermal diffusion process. When the etchant reaches the etch stop where the Boron concentration is above a certain level, the etching process essentially terminates. The benefit of the etch stop is that it provides better control of the etching process as well as the ability to make more sophisticated microstructures. Frequently, both a masking layer and an etch stop layer are used in bulk micromachining processes. Bulk micromachining is a very commercially successful fabrication method for microdevices as demonstrated by the fact that it is the preferred fabrication method to realize silicon pressure sensors, which is one of the largest single commercial markets for micromechanical and MEMS devices. Bulk micromachining is one of the oldest and most mature of the micromachining technologies.

Although bulk micromachining is very mature and well established, for many applications it suffers from several disadvantages. Perhaps one of the most important disadvantages of bulk micromachining is that the aspect ratio (defined as the height to width of the microstructure as well as the variation of the unit height to unit width of the critical features, such as the sidewalls, of microstructure) is severely limited. This is principally due to the crystallographic orientation of the silicon material, which limits the sidewall angle to far less than vertical for the most commonly available orientation of silicon wafers, namely the orientation. Although there are methods of anisotropic etching of oriented wafers that will result in near vertical sidewalls and consequently high aspect ratio microstructures, these types of wafers are extremely expensive and the bottom of the etch trench will expose higher order planes that give a faceted trench bottom, which is very undesirable. Another problem with bulk micromachining is that the ability to achieve precision tolerances of devices or microstructures using this fabrication method is quite limited. Although the etching is very slow along certain crystal planes, it is not zero and therefore there is some undercutting of the masking features. Additionally, although bulk micromachining has been a commercially successful fabrication technology, its use is limited to higher margin devices since it is a comparatively expensive method of manufacturing micromechanical and MEMS devices, particularly when compared to the present invention.

Another popular method of fabricating MEMS and micromechanical devices and systems is surface micromachining. In surface micromachining technology, micromechanical devices and systems are fabricated using thin-film layers of materials, which are deposited and etched on the surface of a silicon wafer. Typically, these thin film materials are directly deposited on a substrate using a widely available deposition technology such as Low-Pressure Chemical Vapor Deposition (LPCVD), Plasma Enhanced Chemical Vapor Deposition (PECVD), or similar methods including nearly all techniques of chemical and physical deposition. Subsequently, the deposited thin films are suitably patterned so as to form microstructures and micromechanical elements.

Generally, two or more thin-films material types are used in surface micromachining with one of the thin-films acting as a mechanical standoff layer and the other thin-film material acting as a mechanically functional or structural layer. There have been many methods reported in the literature for performing a surface micromachining process with the most widely used method being polycrystalline silicon (also known as polysilicon surface micromachining in the art). In polysilicon micromachining, a layer of sacrificial material, commonly a glass that can be deposited using LPCVD or PECVD such as Phospho-Silicate Glass (PSG) or Low-Temperature Oxide (LTO), is first deposited and subsequently patterned and etched. The patterning and etching of the sacrificial layer is very important in that it defines where the structural or mechanical layer will be directly attached to the substrate. A polysilicon layer is then deposited and then patterned and etched so as to define the shape of the structural or mechanical layer. Frequently, the polysilicon is doped with another material such as Boron or Phosphorus, to make the layer electrically conductive. Subsequently, the sacrificial layer is then selectively removed (by selective removal we mean that the sacrificial layer is removed leaving the structural layer unaltered) using what is termed a "release process" so as to free the structural layer from the constraints of the substrate. Commonly, the sacrificial layer is patterned and etched in a way that the overlaying layer of polysilicon that is subsequently deposited can rest on the substrate in desired locations with the specific purpose of providing a means to anchor the free moving elements made from the released structural material. Consequently, with a suitable design, various movable elements with one or more degrees of freedom can be implemented using surface micromachining fabrication methods.

Like bulk micromachining, surface micromachining has also evolved into a commercially viable method of manufacturing MEMS and micromechanical devices and systems. Surface micromachining does afford several distinct advantages over bulk micromachining including: improved device density, better compatibility of the fabrication process with integrated circuit processes, and the ability to define smaller features and therefore achieve a lower fabrication cost. For example, surface micromachining is the preferred method of manufacturing crash airbag accelerometers for automotive applications wherein a surface micromachined inertial sensor is integrated with sophisticated microelectronics at a relatively low per die cost. However, depending on the intended application of the micromechanical device, surface micromachining frequently has some important disadvantages as well, such as limited mechanical component height and/or mass. For example, if a movable microdevice such as an inertial sensor needs sufficient mass for an intended application but is constrained to a limited lateral area due to cost or processing restrictions, conventional surface micromachining may not be a suitable fabrication process since the device will be made from thin-films and therefore will have very small mass levels. The only way to significantly increase the mass of the micromechanical element in surface micromachining is to make the lateral area of the device extremely large, but this consumes considerable substrate area and therefore is very costly and reduces production yield.

More recently, some new MEMS and micromachining processes have become available wherein a very high aspect ratio and relatively tall or deep microstructure can be readily achieved. One of these processes is called Deep Reactive Ion Etching or DRIE which is similar to bulk micromachining described above, but provides a method for achieving a higher aspect ratio for making microstructures and is performed using a dry plasma etch process. In the DRIE process, the single crystal silicon is etched using a dry plasma etching process wherein the etch chemistry is cycled repeatedly from a polymerization cycle to a highly anisotropic silicon etch cycle and back. During the polymerization cycle the sidewalls are coated with a thin protective polymer layer, while during the etching cycles the sidewalls are not attacked but the trench bottom is preferentially etched. Additionally, a masking material such as a thick photoresist or an oxide layer are commonly used to prevent etching of the silicon surface or other pre-defined features in selected areas. The result is a near vertical sidewall in the silicon substrate (i.e., very high levels of anisotrophy) to define very high-aspect ratio microstructures. The etching processes for DRIE have been modified so as to increase the silicon etch rate to high levels, thereby enabling very deep etches into the silicon material to be performed in reasonable times.

One disadvantage of the DRIE micromachining process is that the etch rate is non-uniform depending on the size of the areas exposed. For example, if a substrate has both very small and very large openings in the masking layer, the etching will typically be considerably faster in the larger open areas and slower in the smaller open areas.

Another disadvantage of DRIE technology is the cost. While this technique solves some of the problems of bulk micromachining, it is a single wafer process that takes considerable time on expensive tooling. For example, a common DRIE process is to etch holes completely through the wafer. But this single process step costs as much as a CMOS microelectronics process consisting of hundreds of individual processing steps. Consequently, the technique is limited to very high margin devices and systems.

Frequently in the art, so-called Silicon-On-Insulator (SOI) wafers are the preferred substrate for use in DRIE etching processes. In SOI wafers, an oxide layer is sandwiched between two single crystal silicon layers: one termed the handle wafer and the other the device layer. The device layer can be controlled to a desired thickness ranging from a couple of microns to many hundreds of microns, and it is this layer that is typically etched using DRIE to make the micromechanical elements. One advantage of DRIE etching performed on the device layer of SOI wafers is that the DRIE etching terminates on the buried oxide layer thereby providing better etch characteristics. Despite the ability to make tall and high aspect ratio microstructures using DRIE, the main disadvantage, which has severely limited its use for manufacturing, is cost. Furthermore, if SOI wafers are used in the process, this increases the cost even more since these are relatively expensive substrates compared to single crystal silicon wafers.

Yet another method for making tall and high-aspect ratio micromechanical elements is a process technology called LIGA, which is a German acronym for Lithographie, Galvanoformung, and Abformung, which translates in English to lithography, galvanoforming, and molding. A key element of the conventional method of performing the LIGA process is the use of X-ray exposure for the lithography, which enables exposure through very thick photosensitive polymer layers as well as extraordinary high aspect ratios and extremely high resolutions. Typically, a relatively thick layer (e.g., hundreds to thousands of microns in thickness) of PMMA is put onto the surface of a substrate (although other photosensitive polymers can be used as well) and a specially configured mask is used to perform the exposure. The PMMA layer is then selectively exposed through a specially configured mask using an X-ray source, such as a synchrotron. The high energy and short wavelength of this radiation source provide exposure of the mask pattern completely through the thick PMMA layer with submicron lateral resolution. The exposed PMMA layer on the substrate is then developed so as to remove the exposed PMMA material and leaves behind the areas of PMMA not exposed to the X-ray radiation. Electroplating into the exposed and developed thick PMMA layer is then performed. Typically a metal such as gold or nickel is plated slightly beyond the height of the PMMA layer. The top surface of the electroplated metal is polished so as to remove the surface roughness. The PMMA layer is then selectively removed leaving the metal plated structure. The metal plated structure can be used as the actual part, but commonly it is used to define a mold in order to replicate the part. Replication is performed by making a reverse pattern mold from the shape of the metal plated part out of a polymer material. A metal is then plated into the polymer mold and subsequently the polymer is removed leaving the copied metal part.

The advantage of the LIGA process is the ability to implement microstructures with heights of hundreds to thousands of microns and near vertical sidewalls with sub-micron lateral resolution. The principal disadvantage of LIGA technology is the cost. On a relative cost scale, LIGA is usually the most expensive micromachining process, followed by DRIE technology on SOI wafers, and then bulk micromachining, with surface micromachining on the lower end of the cost scale.

Nevertheless, for many MEMS and micromechanical devices, the currently known fabrication technologies to implement high-aspect ratio devices are far too expensive. Consequently, there is an enormous opportunity for fabrication methods whereby high-aspect ratio microstructures that are tall and have sub-micron lateral features are achieved.

Another disadvantage of LIGA technology is that it is not well suited to make movable components. Most all LIGA-fabricated devices reported to date have been microstructures whereby a static microstructure is shaped or formed from the material. For example, various types of fiber-optic alignment structures have been reported which were made using LIGA fabrication methods. Essentially, these devices consisted of precision micromachined grooves that the fiber optic cable was inserted into so as to hold the cable in position. However, there is a tremendous need for a process to fabricate high-aspect micromechanical devices and systems whereby various elements can move with one or more degrees of freedom.

BRIEF DESCRIPTION OF THE INVENTION

It is, therefore, an object of the present invention to provide a fabrication process or method to make high-aspect ratio micromechanical devices and systems.

It is another object of the present invention to provide a fabrication process or method to make high-aspect ratio micromechanical devices and systems at a low cost.

It is another object of the present invention to provide a fabrication process or method to make high-aspect ratio micromechanical devices and systems with submicron lateral dimensional resolution.

It is another object of the present invention to provide a fabrication process or method to make high-aspect ratio micromechanical devices and systems with submicron micron lateral dimensional resolution and having a dimensional height of between nanometers to microns to several millimeters.

It is another object of the present invention to provide a fabrication process or method to make high-aspect ratio micromechanical devices and systems with submicron micron lateral dimensional resolution and having a dimensional height of between nanometers to microns to several millimeters from plastic materials.

It is another object of the present invention to provide a fabrication process or method to make high-aspect ratio micromechanical devices and systems with submicron micron lateral dimensional resolution and having a dimensional height of between nanometers to microns to several millimeters from plastic materials and at a low cost.

It is another object of the present invention to provide a fabrication process or method to make high-aspect ratio micromechanical devices and systems with submicron micron lateral dimensional resolution and having a dimensional height of between nanometers to microns to several millimeters from a variety of materials including ceramics, polymers, glasses, and semiconductors.

It is another object of the present invention to provide a fabrication process or method to make high-aspect ratio micromechanical devices and systems with submicron micron lateral dimensional resolution and having a dimensional height of between nanometers to microns to several millimeters from a variety of materials including ceramics, polymers, glasses, and semiconductors at a low cost.

It is another object of the present invention to provide a fabrication process or method to make high-aspect ratio micromechanical devices and systems with submicron micron lateral dimensional resolution and having a dimensional height of between nanometers to microns to several millimeters and having elements or components of micromechanical device or system which have one or more degrees of freedom for movement.

It is another object of the present invention to provide a fabrication process or method to make high-aspect ratio micromechanical devices and systems with submicron micron lateral dimensional resolution and having a dimensional height of between nanometers to microns to several millimeters and having elements or components of micromechanical device or system which have one or more degrees of freedom for movement and have a means to retain or anchor the mechanical elements at selected locations on the substrate.

It is another object of the present invention to provide a fabrication process or method to make high-aspect ratio micromechanical devices and systems, with submicron micron lateral dimensional resolution and having a dimensional height of between nanometers to microns to several millimeters and having elements or components of micromechanical device or system which have one or more degrees of freedom for movement and have a means to retain or anchor the mechanical elements at selected locations on the substrate and which are made from plastic materials.

It is another object of the present invention to provide a fabrication process or method to make high-aspect ratio micromechanical devices and systems with submicron micron lateral dimensional resolution and having a dimensional height of between nanometers to microns to several millimeters and having elements or components of micromechanical device or system which have one or more degrees of freedom for movement and have a means to retain or anchor the mechanical elements at selected locations on the substrate and which are made from plastic materials and at a low cost.

It is another object of the present invention to provide a fabrication process or method to make high-aspect ratio micromechanical devices and systems with submicron micron lateral dimensional resolution and having a dimensional height of between nanometers to microns to several millimeters and having elements or components of micromechanical device or systems which have one or more degrees of freedom for movement and have a means to retain or anchor the mechanical elements at selected locations on the substrate and which are made from a variety of materials including ceramics, polymers, glasses, and semiconductors.

It is another object of the present invention to provide a fabrication process or method to make high-aspect ratio micromechanical devices and systems with submicron micron lateral dimensional resolution and having a dimensional height of between nanometers to microns to several millimeters and having elements or components of micromechanical device or system which have one or more degrees of freedom for movement and have a means to retain or anchor the mechanical elements at selected locations on the substrate and which are made from a variety of materials including ceramics, polymers, glasses, and semiconductors and at a low cost.

It is another object of the present invention to provide a fabrication process or method to make high-aspect ratio micromechanical devices and systems with submicron micron lateral dimensional resolution and having a dimensional height of between nanometers to microns to several millimeters on substrates containing microelectronics.

It is another object of the present invention to provide a fabrication process or method to make high-aspect ratio micromechanical devices and systems with submicron micron lateral dimensional resolution and having a dimensional height of between nanometers to microns to several millimeters and having elements or components of micromechanical devices or systems which have one or more degrees of freedom for movement onto substrates containing microelectronics.

It is another object of the present invention to provide a fabrication process or method to make high-aspect ratio micromechanical devices and systems with submicron micron lateral dimensional resolution and having a dimensional height of between nanometers to microns to several millimeters and having elements or components of micromechanical devices or systems which have one or more degrees of freedom for movement and have a means to retain or anchor the mechanical elements at selected locations on substrates containing microelectronics.

It is another object of the present invention to provide a fabrication process or method to make high-aspect ratio micromechanical devices and systems with submicron micron lateral dimensional resolution and which are made from plastic and having a dimensional height of between nanometers to microns to several millimeters and having elements or components of micromechanical device or system which have one or more degrees of freedom for movement and have a means to retain or anchor the mechanical elements at selected locations onto substrates containing microelectronics.

It is another object of the present invention to provide a fabrication process or method to make high-aspect ratio micromechanical devices and systems with submicron micron lateral dimensional resolution and which are made from plastic and at low cost and having a dimensional height of between nanometers to microns to several millimeters and having elements or components of micromechanical devices or systems which have one or more degrees of freedom for movement and have a means to retain or anchor the mechanical elements at selected locations onto substrates containing microelectronics.

It is another object of the present invention to provide a fabrication process or method to make high-aspect ratio micromechanical devices and systems with submicron micron lateral dimensional resolution and which are made from a variety of materials including ceramics, polymers, glasses, and semiconductors and having a dimensional height of between nanometers to microns to several millimeters and having elements or components of micromechanical devices or systems which have one or more degrees of freedom for movement and have a means to retain or anchor the mechanical elements at selected locations onto substrates containing microelectronics.

It is another object of the present invention to provide a fabrication process or method to make high-aspect ratio micromechanical devices and systems with submicron micron lateral dimensional resolution and which are made from a variety of materials including ceramics, polymers, glasses, and semiconductors and at a low cost and having a dimensional height of between nanometers to microns to several millimeters and having elements or components of micromechanical devices or systems which have one or more degrees of freedom for movement and have a means to retain or anchor the mechanical elements at selected locations onto substrates containing microelectronics.

Many device and system objectives can be readily realized in the present invention by using the novel and very flexible fabrication technology or method described herein. The present invention results from the realization that silicon, semiconductor-based, and LIGA-based microfabrication or MEMS fabrication technologies is far too expensive for many device and system applications. The reason for this is that in general, semiconductor-starting materials, typically in the form of wafers, are considerably more expensive than other materials such as plastics, polymers, glass, and ceramics. Furthermore, the processing techniques used to fabricate devices in semiconductors including thin-film depositions, photolithography, etching, and many others, are relatively expensive processing steps and typically tens to hundreds of these expensive processing steps will be required to implement a micromechanical device or system. Consequently, the overall cost including materials and fabrication costs for micromechanical devices and systems are expensive. Frequently, it is argued that batch fabrication, whereby hundreds to thousands of devices or systems are fabricated simultaneously, result in a lower per device or system cost. However, for many semiconductor-based micromechanical and MEMS devices or systems the cost of a semiconductor substrate is not low enough for a product made from these types of materials to be competitive in the marketplace.

The present invention is directed to a fabrication technology or method that allows micromechanical devices or systems with micron or even submicron lateral and vertical dimensions to be implemented at a low cost due to the materials used to make the devices or systems as well as the fabrication methods used. Due to the mechanical nature of MEMS and micromechanical devices or systems, it is critically important that the device or system have one or more elements or components having the ability to move, either under an external or internal influence, with one or more degrees of freedom. The present invention also describes methods by which micromechanical elements or components can move, either under an external or internal influence, with one or more degrees of freedom and can be simultaneously fabricated onto these other materials.

Frequently, it is important and useful to have the ability to integrate electronics, or photonics, or both with micromechanical elements. The present invention describes a method by which high aspect ratio micromechanical components can be readily integrated with electronics, photonics, and electro-opto devices and systems.

The present invention is extremely flexible in the types of devices and systems, which can be implemented, as well as the materials used. In particular, we describe the fabrication of devices and systems from materials such as many different types of plastics or plastic laminates, polymers either in sheet or thin-film form, glasses of many different types and makes, and ceramics or many types and makes. Consequently, we describe a fabrication technology or method having considerable potential in many products and for many applications and markets including industrial, commercial, consumer and military.

BRIEF DESCRIPTION OF THE DRAWINGS

FIG. 1 is a detailed description of the invention The present invention is directed to a fabrication technology or methods for implementing micromechanical devices and systems, Micro-Electro-Mechanical Systems (MEMS), Micro-Electro-Opto-Mechanical Systems (MOEMS), as well as Nanotechnology devices and Systems, Nano-Electro-Mechanical Systems (NEMS), and Nano-Electro-Opto-Mechanical Systems (NEOMS). A sectional view of a generic type of micromechanical or nanomechanical device or system 10 is illustrated in FIG. 1. The dimensions of the features of the device or system 10 can vary from nanometers to millimeters, depending on the application requirements for functionality, as well as cost and manufacturability. Furthermore, the materials used to implement the micromechanical or nanomechanical device or system 10 can vary over a large range, including plastics, polymers, glasses, and ceramics.

One key idea of the present invention is the ability to form high-resolution shapes in low-cost materials using a technology referred to as replication. In replication, a tool master, sometimes also called a tool insert, is made using a suitable technology to define the tool master with high-aspect ratio and submicron lateral. The tool master may have vertical dimensions ranging from nanometers to millimeters. Commonly, in the replication of larger devices ranging from microns to millimeters, the tool master is made from a metal, but the present invention is not limited specifically to metals, and can include certain ceramics, polymers, plastics, alloys, and even semiconductor materials such as silicon.

A variety of techniques can be used to implement the tool master and the exact technique used will typically depend on the materials from which the tool master is made as to the exact requirements of the replicated shape and the materials from which the replicated parts are to be made.

Figure 1:
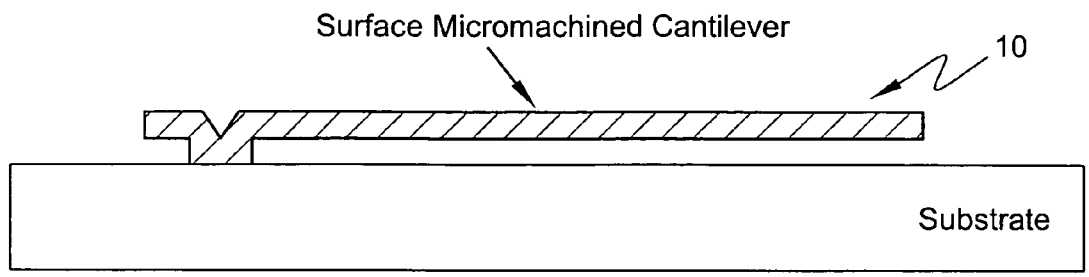
FIG. 1 shows a generic micromechanical device.
Figure 2A:
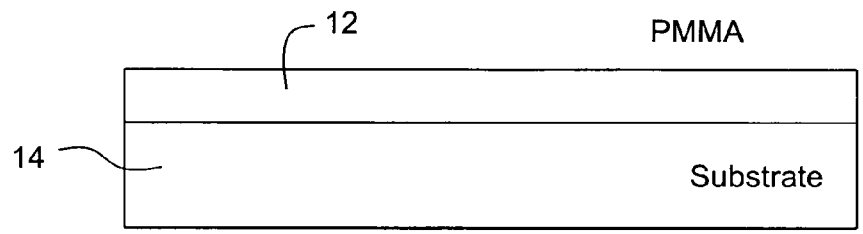
FIGS. 2(a)–(f) show the fabrication of a tool master using LIGA technology.
Figure 2B:
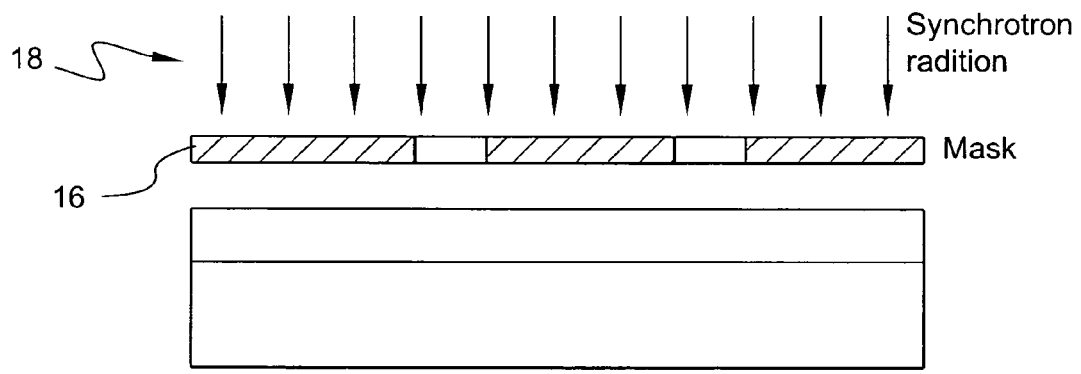
Figure 2C:
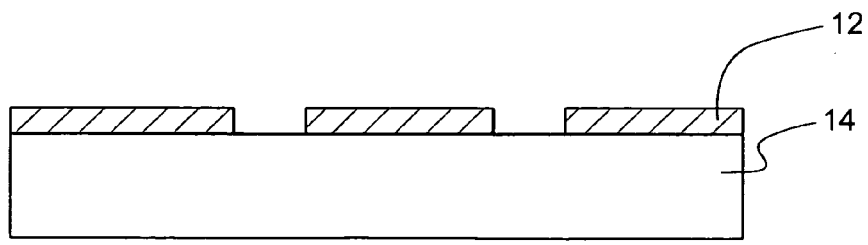
Figure 2D:
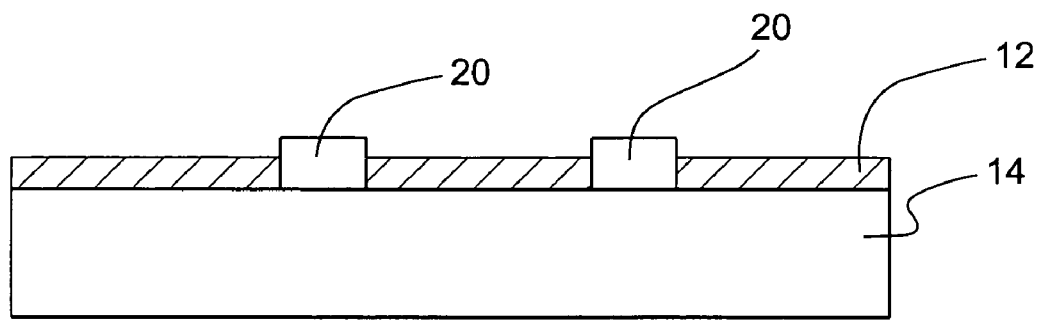
Figure 2E:
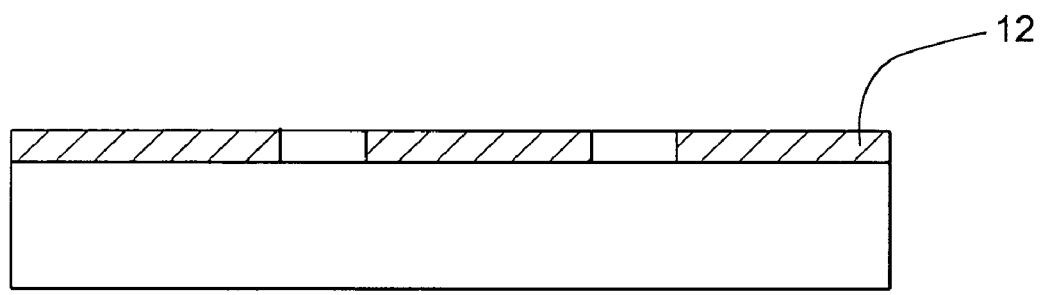
Figure 2F:
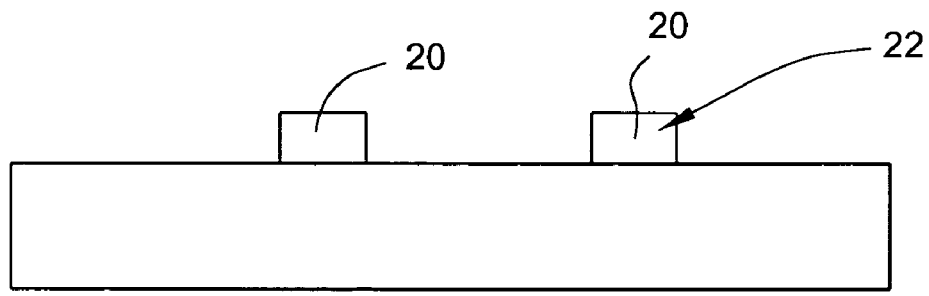

In one example, a tool master is made using a truncated LIGA fabrication technology. As discussed above, LIGA is a German acronym for Lithographie, Galvanoformung, and Abformung, which translates in English to lithography, galvanofroming, and molding. A key element of the LIGA process is the use of X-ray synchrotron exposure for the lithography which enables exposure through very thick photosensitive polymer layers, as well as extraordinary high aspect ratios with submicron lateral resolution. In the LIGA process for a tool master, a layer 12 of PMMA (e.g., tens to thousands of microns in thickness) is put onto the surface of a substrate 14 (See FIG. 2a) and a specially configured mask 16 is used to perform the exposure. The PMMA layer 12 is then selectively exposed through a specially configured mask 16 using an X-ray source, such as a synchrotron radiation 18 (FIG. 2b). The high energy and short wavelength of this radiation source 18 provide exposure of the mask pattern completely through the thick PMMA layer 12 with submicron lateral resolution. The exposed PMMA layer 12 on the substrate 14 is then developed (FIG. 2c) so as to remove the exposed PMMA material 12 and leaves behind the areas of PMMA not exposed to the X-ray radiation. Electroplating into the exposed and developed thick PMMA layer 12 is then performed (FIG. 2d). Typically a metal 20 such as gold or nickel is plated slightly beyond the height of the PMMA layer. The top surface of the electroplated metal is polished (FIG. 2e) so as to remove the surface roughness. The PMMA layer 12 is then selectively removed leaving the metal plated structure (2f). The metal plated structure 22 can be used as the tool master.

Figure 3A:
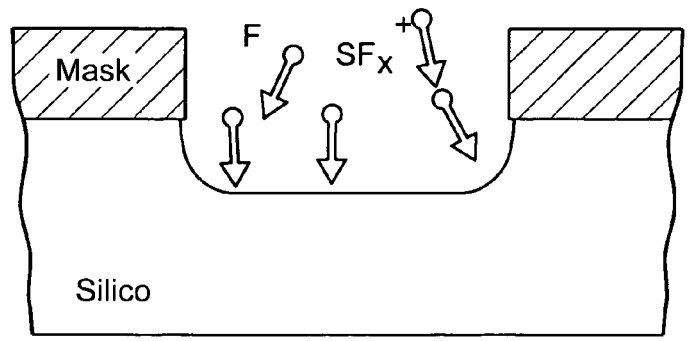
FIG. 3 illustrates the DRIE process.
Figure 3B:
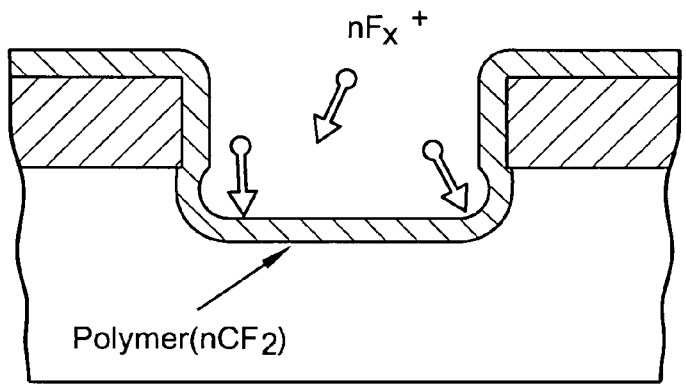
Figure 3C:
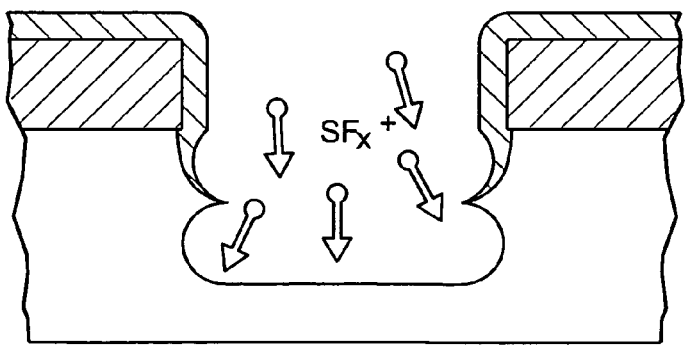

Another variation of making a tool master is to use a dry plasma etching technology for silicon referred to as Deep Reactive Ion Etching, or DRIE. In DRIE, silicon can be etched deep into the silicon substrate with very high aspect ratios (FIG. 3). This technique can be use to make a tool master from silicon which can then be used to emboss into various materials.

Other methods for making a tool master include: laser micromachining, electro-discharge micromachining (EDM), EFAB, stereo-lithography, etc., of which are considered as part of the present invention. The specific technique used to fabricate the tool master will depend on many factors, such as the cost constraints, materials to be used, materials from which to replicate the parts, speed, acceptable tool wear, etc.

Figure 4:
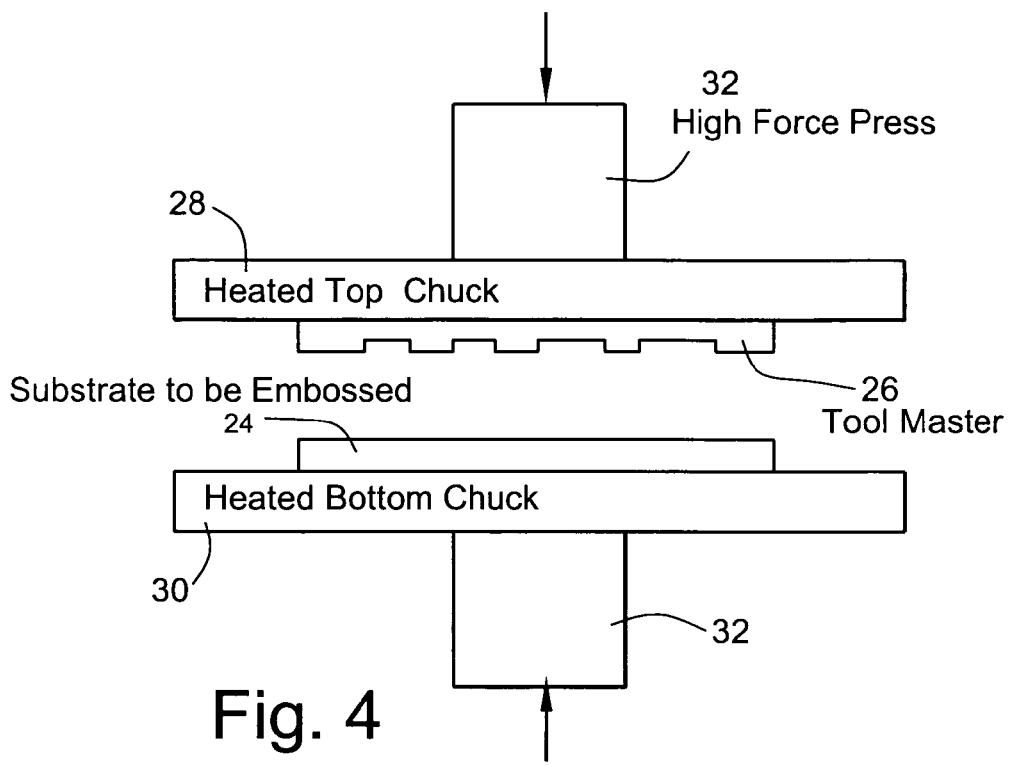
FIG. 4 shows a hot embossing setup.

Once the tool master has been satisfactorily fabricated, it can be used to make replicate parts. In general this process is performed by heating the tool master and the sample to be embossed to a temperature at or above the glass transition temperature of the substrate into which the embossing is to be performed. In some materials, the elevated temperature is not referred to as a glass transition temperature, but as a yield or flow temperature. For the purposes of the present invention, the meaning intended is that the substrate is elevated in temperature to a point at which the material becomes compliant. A diagram of the set up for hot embossing is shown in the FIG. 4.

Once the substrate to be embossed 24 and the tool master 26 are heated to the proper temperature, then the tool master 26 and substrate 24 are pressed into one another with sufficient force to imprint the shape and form of the tool master 26 into the material of the substrate 24. Such heating can be accomplished using a heated top chuck 28 holding the tool master 26 and a heated bottom chuck 30 supporting the substrate 24. Sufficient force can be provided by a high force press 32. The speed and force of the embossing will depend on several factors, including the type of material 24 that is being embossed and the features of the tool master 26 to be emulated in the substrate material 24. Once the tool master has been fully pressed into the substrate 24, the temperature of the composite of the tool master 26 and substrate 24 are lowered in temperature to below the glass transition temperature or a temperature at which the material 24 becomes substantially less compliant. Importantly, the temperature of the substrate material 24 is lowered so as to make the substrate material 24 more resistant to yielding or flowing. Subsequently, sufficient force is applied to the tool master 26 and substrate 24 in opposing directions so as to separate the tool master 26 and substrate 24. The substrate 24 that has been embossed is then cooled to ambient temperature. Preferably, the hot embossing is performed under vacuum conditions.

Figure 5:
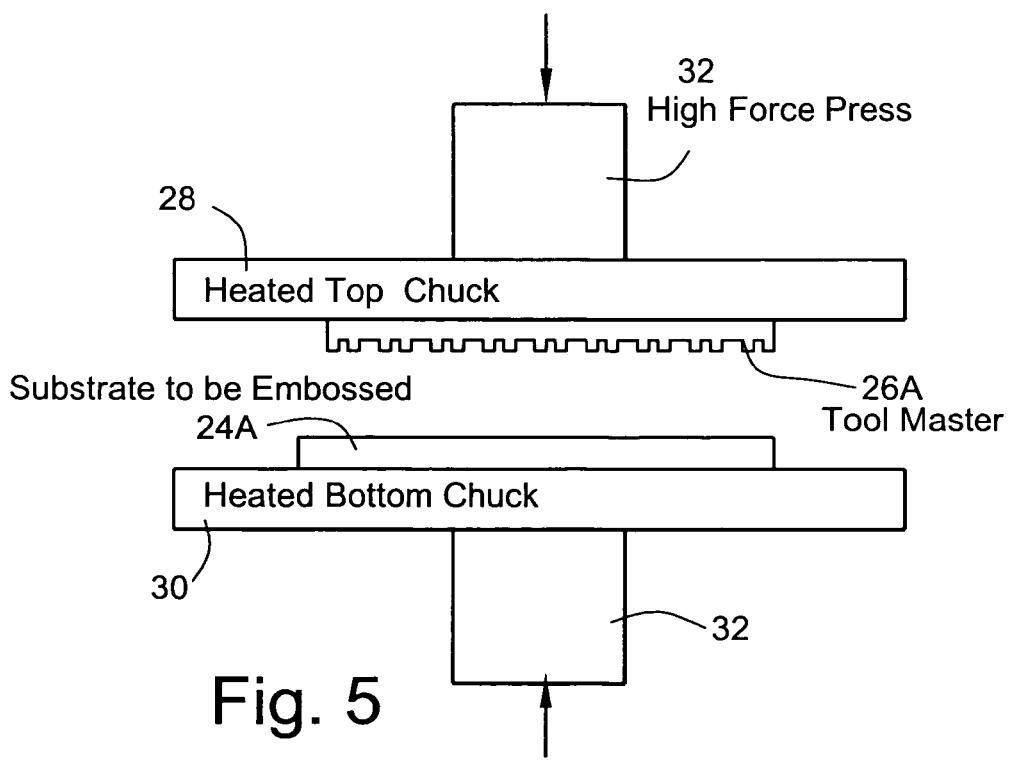
FIG. 5 shows the replication of microdevices in batches.

Although the technique for replication recited above is well suited for replicating a single part in each emboss, the technique is also suited to batch fabrication, whereby the tool insert 26A has many duplications of the part to be replicated (FIG. 5). This will allow the per part cost to be lowered dramatically. The primary limitations to the number of parts that can be replicated simultaneously are the size and force capacity of the embossing tool 26A as well as the specific tool 26A and substrate material 24A characteristics.

The hot embossing structure is well suited to making high aspect ratio structures in a variety of different materials. The critical elements in the process are the tool master, the temperature, the forces, and the materials that are being embossed. Using a high aspect ratio tool master with submicron lateral dimensions and tall features, fabricated using a technique such as LIGA, enables the shape and dimensions of the tool master to be faithfully replicated in the substrate material with high fidelity. Of course, the process described herein can be used to make less demanding shapes and dimensions as well with equal or greater ease than many competing technologies.

Figure 6:
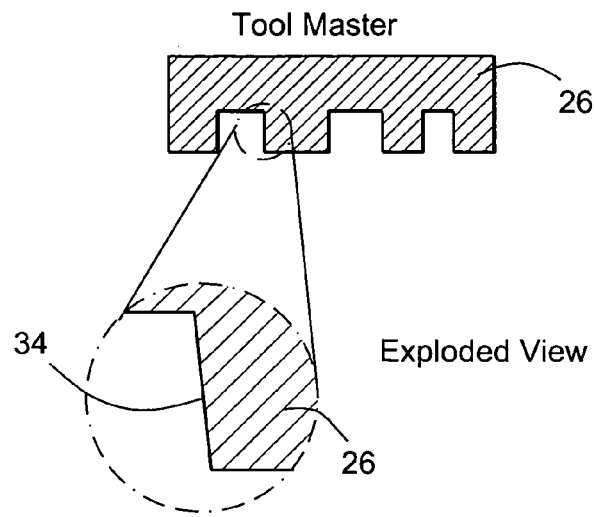
FIG. 6 illustrates a sidewall profile of a tool master for hot embossing.

A criterion for the tool master 26 is that it has no re-entrant features. Preferably the sidewalls 34 of the tool master 26 have a slight slope since this helps to ensure a good de-embossing process when the tool master 26 is removed from the substrate 24 (FIG. 6).

The process described above recites a method to fabricate a static, i.e., non-movable microstructure using hot embossing. The present invention also encompasses a method of fabricating high aspect ratio microstructures that can move as well. In one embodiment of this process, the substrate material 36 is composed of a laminate composite of different materials wherein the materials have different properties so as to allow the underlying material layer to be selectively removed subsequent to the embossing procedure (FIG. 7).

Figure 8A:
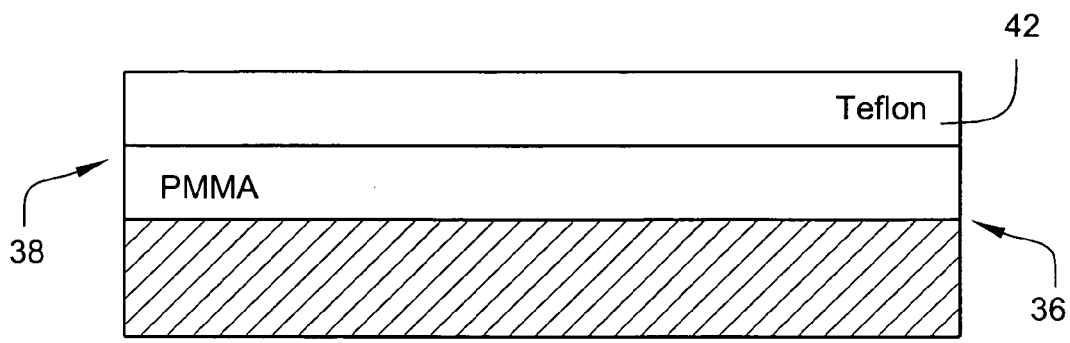
FIGS. 8(a)–(c) shows the hot embossing of a laminated substrate to fabricate moving micromechanical elements.
Figure 8B:
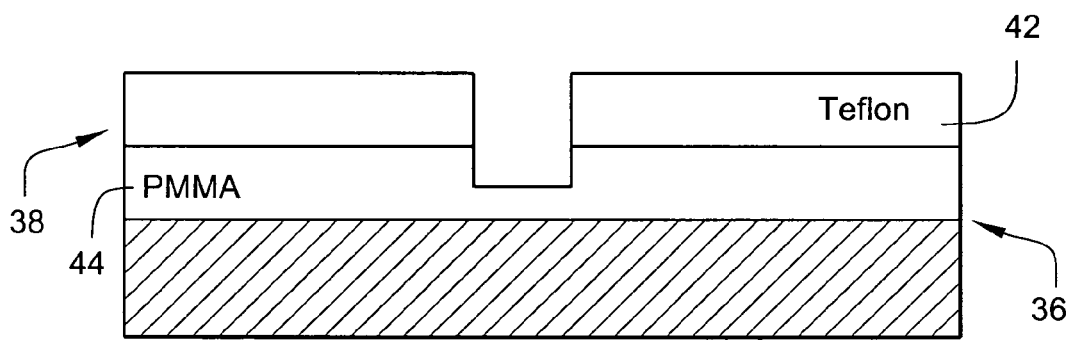
Figure 8C:
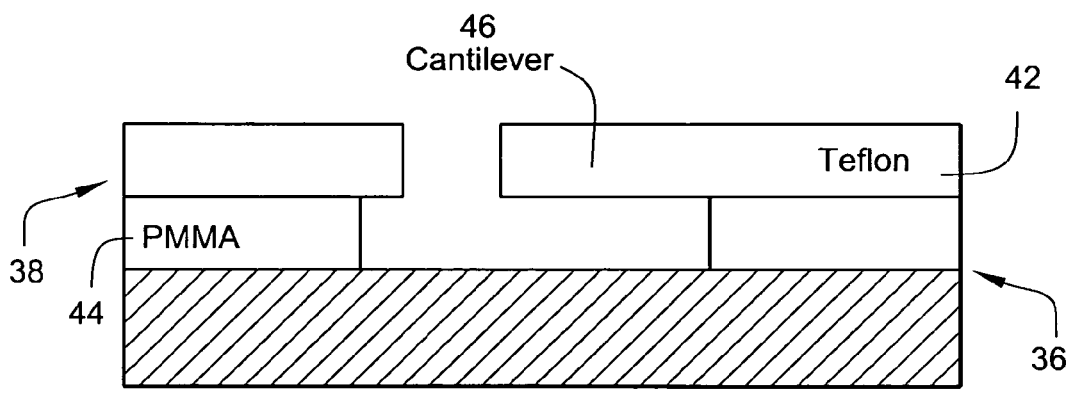
Figure 9A:
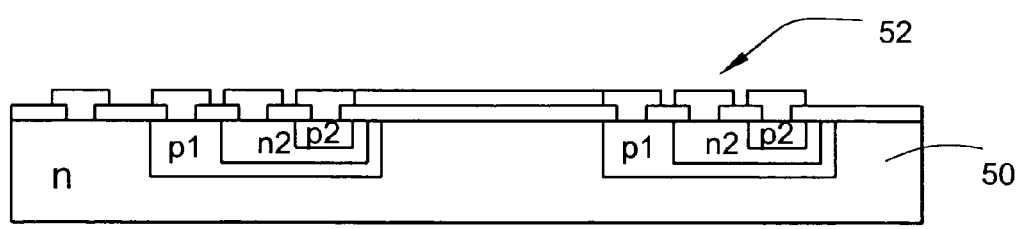
FIGS. 9(a)–(d) show the fabrication of movable micromechanical devices on microelectronics wafers.
Figure 9B:
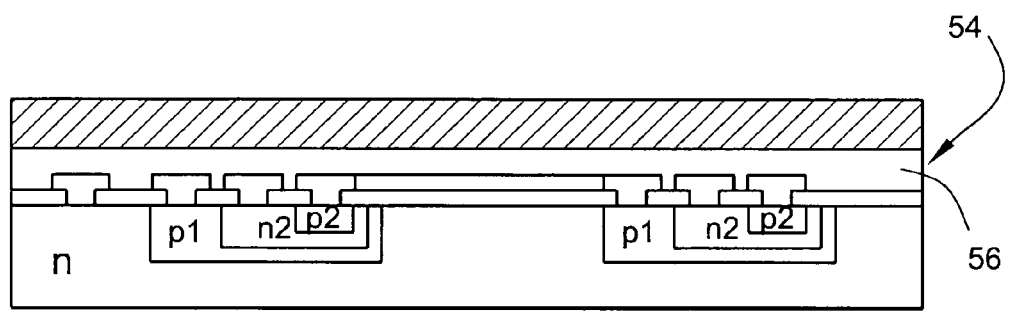
Figure 9C:
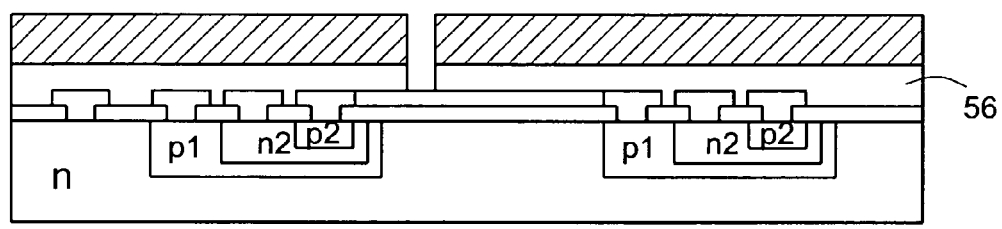
Figure 9D:
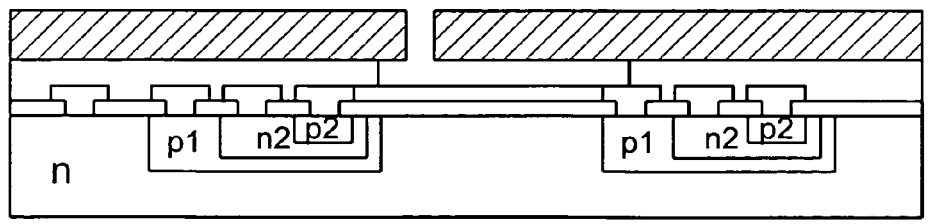

A replication process enabling moving components is illustrated in FIG. 8 below. As can be seen, the substrate 36 to be embossed is actually composed of two or more different materials 38 that are laminated, bonded or adjoined together in some fashion (FIG. 8a). The substrate 36 is then embossed as was described above. In many cases, the glass transition temperatures or yielding or flowing temperatures of the materials of the composite substrate are relatively close to one another. Alternatively, the embossing temperature would be set at a point exceeding the temperature of the material with higher glass transition temperatures or yielding or flowing temperature. Once the embossing has been completed and the tool master 26 removed from the substrate 36, the substrate is allowed to cool to ambient temperature (FIG. 8b).

Subsequently, the underlying layer of substrate material is removed similar to the release process described above in surface micromachining (FIG. 8c). Among the techniques which can be used to remove the underlying layer include: wet etching; dry plasma etching; ashing; or any other chemical, electrochemical, chemical mechanical, photochemical, etc., means that will remove the material which is desired to be removed. Preferably, the overlying material of the laminate will have a favorable selectivity, that is, the overlying material is not attacked or degraded during the process used to remove the underlying material layer. That is, the means used to remove the underlying material layer should be relatively innocuous to the overlying material layer.

Figure 7:
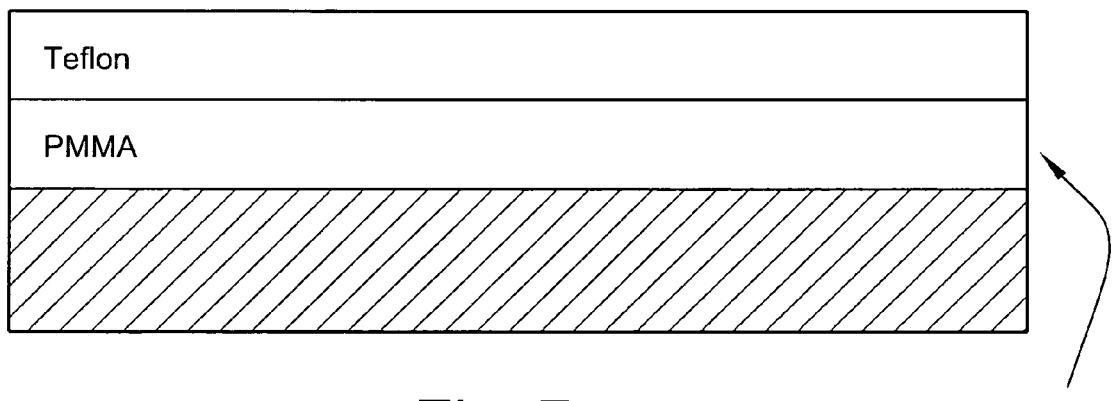
FIG. 7 shows a laminated substrate prior to hot embossing which is employed to fabricate movable micromechanical elements.

In one embodiment, the laminate is composed of an overlying layer 42 of a chemically resistant material such as Teflon and the underlying layer 44 of material is a polymer, such as PMMA, which can be easily removed in a wet chemical immersion without attack of the overlying Teflon material layer 42 (FIG. 7). In this configuration, the Teflon layer 42 is the structural layer from which the micromechanical devices are made from and the PMMA is the sacrificial layer. This is only one example of a material base from which moving elements 46 can be made using the present invention and it must be appreciated that there are many combinations of materials that can be employed in such a manner to make mechanically moving elements, including various ceramics, polymers, and plastics.

There are many other configurations and combinations that are encompassed within the present invention. For example, various techniques may be used to enhance the bonding of the two or more materials of the substrate to be embossed. One technique would be to use an adhesion promoter to bond the layers. Another technique would be to use a thermal-activated, a photo-activated or plasma-activated process to bond the materials. There are other techniques as well.

It is possible using hot embossing technology to perform an alignment prior to the embossing step. Consequently, features can be made that are registered to existing patterns on the surface of the substrate Other methods for making micromechanical devices using two or more layers of materials are also described herein. In one approach, the sacrificial layer and the structural layer are deposited onto the surface of a substrate. For example, a PMMA layer could be spun onto the surface followed by a CVD deposition of a Teflon layer. Using this method, the deposited layers would be conformal to the surface of the substrate as well as to any pre-patterning. For example, the PMMA layer could be patterned and etched to define a layout configuration for a sacrificial layer and then a structural layer could be deposited and subsequently the composite layers would then be embossed. The sacrificial layer could then be selectively removed.

Additionally, with suitable design approaches, micromechanical devices with one or more degrees of freedom can be implemented. Furthermore, with suitable design approaches wherein selected locations are anchored to the substrate, the movable micromechanical elements can be restrained to the substrate but still retain one or more degrees of freedom of movement.

The present invention can be used to make moving or non-moving high aspect ratio micromechanical devices onto microelectronics substrates. In this configuration, a fully processed microelectronics substrate 50 has layers of materials that have been deposited or adjoined to the surface of a microelectronics substrate and which can be embossed 52 (FIG. 9). The composite substrate is then hot embossed 54 to define micromechanical elements. If movable elements are desired, a sacrificial layer 56 can be used and removed so as to allow desired micromechanical elements to move freely with one or more degrees of freedom. This same approach can be performed on substrates with integrated electronics, integrated photonics, integrated electro-photonics, and electro-mechanical-photonics.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A method of fabricating a movable, high-aspect ratio micromechanical device or system with dimensions that can vary from nanometers to millimeters, the method comprising the steps of:
    providing a substrate sized for the micromechanical device or system to be fabricated, the substrate being formed from a material composed of a laminate comprised of at least an overlying material layer and an underlying material layer, said materials having different properties so as to allow the underlying material layer to be selectively removed, whereby the overlying material is then released and thereby movable,
    forming a tool master with a high-aspect ratio, submicron lateral resolution, and vertical dimensions substantially corresponding to the vertical dimensions of the device or system to be fabricated,
    heating the tool master and the substrate to a temperature exceeding the temperature of the material with a higher yielding or flowing temperature, at which both the overlying material and the underlying material become compliant, whereby the substrate materials are less resistant to yielding or flowing,
    pressing the heated tool master and substrate into one another with sufficient force so as to imprint the shape and form of the tool master into the material of the substrate,
    lowering the temperature of the pressed together tool master and substrate to a temperature at which the substrate materials become substantially less compliant, whereby the substrate materials are more resistant to yielding or flowing,
    separating the tool master and substrate, and
    cooling the separated and imprinted substrate to ambient temperature.

2. The method of claim 1, wherein the higher yielding or flowing temperature is the glass transition temperature of said substrate material.

3. The method of claim 1, wherein the tool master has a plurality of duplications of the micromechanical device or system to be replicated.

4. The method of claim 1, wherein the step of pressing the heated tool master and substrate into one another occurs with a speed and force that depend on the types of materials used for the substrate and the features of the tool master to be imprinted in the substrate materials.

5. The method of claim 2, wherein the step of lowering the temperature of the pressed together tool master and substrate comprises lowering said temperature to below the glass transition temperature of the substrate material.

6. The method of claim 1, wherein the step of providing the substrate comprises providing materials selected from the group consisting of a plastic, a polymer, a glass, and a ceramic.

7. The method of claim 1, wherein the step of forming the tool master comprises forming the tool master using a material selected from the group consisting of a metal, a ceramic, a polymer, a plastic, an alloy, and a semiconductor material.

8. The method of claim 1, wherein the step of forming the tool master comprises using a lithography, galvanofroming, and molding ("LIGA") fabrication method to form the tool master.

9. The method of claim 1, wherein the step of forming the tool master comprises using a fabrication method selected from the group consisting of Deep Reactive Ion Etching ("DRIB"), laser micromachining, electro-discharge micromachining ("EDM"), EFAB, and stereo-lithography.

10. The method of claim 1, wherein the step of forming the tool master comprises the steps of:
    placing a thick layer of PMMA onto the surface of a second substrate, selectively exposing the PMMA layer through a mask pattern using an X-ray source,
    developing the exposed PMMA layer on the second substrate so as to remove the exposed PMMA material and leave behind areas of the PMMA not exposed to the X-ray source,
    electroplating into the exposed and developed PMMA layer,
    polishing the electroplated metal's top surface so as to remove the surface's roughness, and
    selectively removing the PMMA layer so as to leave the metal plated structure, whereby the metal plated structure can be used as the tool master.

11. The method of claim 10, wherein the step of selectively exposing the PMMA layer using an X-ray source, comprises using a synchrotron X-ray source, whereby the high energy and short wavelength of this radiation source provide exposures of the mask pattern completely through the thick PMMA layer with submicron lateral resolution.

12. The method of claim 10, wherein the step of electroplating into the exposed and developed PMMA layer comprises electroplating gold or nickel slightly beyond the height of the PMMA layer.

13. The method of claim 1, further comprising the step of performing an alignment prior to the step of pressing the heated tool master and substrate into one another, whereby features are made that are registered to existing patterns on the surface of the substrate.

14. A method of fabricating a movable, high-aspect ratio micromechanical device or system with dimensions that can vary from nanometers to millimeters and from a variety of materials, the method comprising the steps of:

providing a substrate sized for the micromechanical device or system is to be fabricated, the substrate being formed from a material composed of a laminate comprised of at least a structural layer and a sacrificial layer, said materials having different properties so as to allow the sacrificial layer to be selectively removed, whereby the structural layer is then released and thereby movable, forming a tool master with a high-aspect ratio, submicron lateral resolution, and vertical dimensions substantially corresponding to the vertical dimensions of the micromechanical devices or system to be fabricated, heating the tool master and the substrate to a temperature exceeding the temperature of the material with a higher glass transition temperature or yielding or flowing temperature, pressing the heated tool master and substrate into one another with sufficient force so as to imprint the shape and form of the tool master into the materials of the substrate, lowering the temperature of the pressed together tool master and substrate to a temperature at which the substrate materials become more resistant to yielding or flowing, separating the tool master and substrate, and cooling the separated and imprinted substrate to ambient temperature, and subsequently removing the underlying layer of substrate material using a release process.

15. The method of claim 14, wherein the step of removing the sacrificial layer of substrate material comprises using a release process selected from the group consisting of wet etching, dry plasma etching, ashing, and chemical etching.

16. The method of claim 15, wherein the step of removing the sacrificial layer of substrate material using chemical etching comprises using a chemical etching selected from the group consisting of electrochemical etching, chemical mechanical etching, and photochemical etching.

17. A method of fabricating a movable, high-aspect ratio micromechanical device or system with dimensions that can vary from nanometers to millimeters and from a variety of materials, the method comprising the steps of:

providing a substrate sized for the micromechanical device or system is to be fabricated, the substrate being formed from a material composed of a laminate comprised of at least a structural layer and a sacrificial layer, said materials having different properties so as to allow the sacrificial layer to be selectively removed, whereby the structural layer is then released and thereby movable, forming a tool master with a high-aspect ratio, submicron lateral resolution, and vertical dimensions substantially corresponding to the vertical dimensions of the micromechanical devices or system to be fabricated, heating the tool master and the substrate to a temperature exceeding the temperature of the material with a higher glass transition temperature or yielding or flowing temperature, pressing the heated tool master and substrate into one another with sufficient force so as to imprint the shape and form of the tool master into the materials of the substrate, lowering the temperature of the pressed together tool master and substrate to a temperature at which the substrate materials become more resistant to yielding or flowing, separating the tool master and substrate, and cooling the separated and imprinted substrate to ambient temperature, and subsequently removing the underlying layer of substrate material using a release process, and wherein the laminate is composed of an structural layer of a chemically resistant material and the sacrificial layer of material is a polymer, which can be easily removed in a wet chemical immersion without attack of the structural layer.

18. The method of claim 17, wherein the structural layer is Teflon and the sacrificial layer is PMMA.

19. The method of claim 14, wherein the substrate laminate is bonded using an adhesion promoter to bond the layers.

20. The method of claim 14, wherein the substrate laminate is bonded using process selected from the group consisting of thermal-activation, photo-activation or plasma-activation.

21. The method of claim 17, wherein the step of providing a substrate from which the micromechanical device or system is to be fabricated comprises forming the substrate from a material composed of a laminate in which the sacrificial layer and the structural layer are deposited onto the surface of the substrate.

22. The method of claim 21, wherein the sacrificial layer is a PMMA layer spun onto the surface of the substrate and the structural layer is a CVD deposition of a Teflon layer.

23. The method of claim 22, wherein the PMMA layer is patterned and etched to define a layout configuration for a sacrificial layer, the structural layer is deposited, a composite of the sacrificial and structural layers is embossed, and the sacrificial layer is then selectively removed.

24. The method of claim 1, wherein the tool master's sidewalls have a slight slope which facilitates removal of the tool master from the substrate.

25. The method of claim 1, wherein the substrate is a pre-processed wafer having microelectronics on it.

26. The method of claim 1, wherein the substrate is a pre-processed wafer having optical components on it.

27. The method of claim 14, wherein the substrate is a pre-processed wafer having microelectronics on it.

28. The method of claim 14, wherein the substrate is a pre-processed wafer having optical components on it.

* * * * *